(12) United States Patent
Kruijt-Stegeman et al.

(10) Patent No.: US 8,968,630 B2
(45) Date of Patent: Mar. 3, 2015

(54) IMPRINT LITHOGRAPHY

(75) Inventors: Yvonne Wendela Kruijt-Stegeman, Eindhoven (NL); Arie Jeffrey Den Boef, Waalre (NL); Andre Bernardus Jeunink, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 621 days.

(21) Appl. No.: 12/912,586

(22) Filed: Oct. 26, 2010

(65) Prior Publication Data

US 2011/0095455 A1 Apr. 28, 2011

Related U.S. Application Data

(60) Provisional application No. 61/255,590, filed on Oct. 28, 2009.

(51) Int. Cl.
| | |
|---|---|
| *B29C 59/02* | (2006.01) |
| *G03F 7/00* | (2006.01) |
| *B82Y 10/00* | (2011.01) |
| *B82Y 40/00* | (2011.01) |
| *G03F 9/00* | (2006.01) |

(52) U.S. Cl.
CPC ............... *G03F 7/0002* (2013.01); *B82Y 10/00* (2013.01); *B82Y 40/00* (2013.01); *G03F 9/7076* (2013.01)
USPC ............................ 264/496; 264/406; 425/171

(58) Field of Classification Search
USPC ......................................... 264/293, 496, 406
See application file for complete search history.

(56) References Cited

U.S. PATENT DOCUMENTS

| | | | |
|---|---|---|---|
| 4,731,155 A | 3/1988 | Napoli | |
| 5,772,905 A | 6/1998 | Chou | |
| 6,334,960 B1 | 1/2002 | Willson | |
| 7,618,250 B2 | 11/2009 | Van Santen et al. | |
| 2002/0098426 A1 | 7/2002 | Sreenivasan | |
| 2004/0124566 A1* | 7/2004 | Sreenivasan et al. | 264/494 |
| 2005/0041256 A1* | 2/2005 | Kreuzer | 356/508 |
| 2005/0064344 A1 | 3/2005 | Bailey | |
| 2005/0274693 A1 | 12/2005 | Heidari | |

(Continued)

FOREIGN PATENT DOCUMENTS

| | | |
|---|---|---|
| JP | 2006-165371 | 6/2006 |
| JP | 2006-332677 | 12/2006 |
| JP | 2007-103915 | 4/2007 |
| JP | 2007-140460 | 6/2007 |
| JP | 2008-041852 | 2/2008 |
| JP | 2009-200466 | 9/2009 |
| WO | WO 02/067055 | 8/2002 |

OTHER PUBLICATIONS

Haisma, et al., "Mold-assisted nanolithography: A process for reliable pattern replication", J. Vac. Sci. Technol. B, vol. 14(6), Nov./Dec. 1996, pp. 4124-4128.
Japanese Office Action mailed May 1, 2012 in corresponding Japanese Patent Application No. 2010-236003.
Japanese Office Action mailed May 28, 2013 in corresponding Japanese Patent Application No. 2010-236003.

*Primary Examiner* — Dimple Bodawala
*Assistant Examiner* — Robert J Grun
(74) *Attorney, Agent, or Firm* — Pillsbury Winthrop Shaw Pittman LLP

(57) ABSTRACT

An imprint lithography template is provided with an alignment mark, wherein the alignment mark is formed from dielectric material having a refractive index which differs from the refractive index of the imprint lithography template, the dielectric material having a thickness which is such that it provides a phase difference between alignment radiation which has passed through the dielectric material and alignment radiation which has not passed through the dielectric material.

10 Claims, 5 Drawing Sheets

(56) References Cited

U.S. PATENT DOCUMENTS

| | | |
|---|---|---|
| 2006/0158651 A1* | 7/2006 | Watts et al. .................. 356/401 |
| 2006/0267231 A1 | 11/2006 | Van Santen et al. |
| 2006/0275524 A1 | 12/2006 | Van Santen et al. |
| 2006/0279004 A1 | 12/2006 | Suehira |
| 2007/0187875 A1 | 8/2007 | Terasaki |
| 2007/0266875 A1* | 11/2007 | Berge ........................... 101/481 |
| 2008/0131791 A1 | 6/2008 | Cho |
| 2009/0250840 A1 | 10/2009 | Selinidis |
| 2010/0007863 A1 | 1/2010 | Jordanoska |
| 2010/0092599 A1* | 4/2010 | Selinidis et al. .............. 425/470 |

\* cited by examiner

IMPRINT LITHOGRAPHY

This application claims priority and benefit under 35 U.S.C. §119(e) to U.S. Provisional Patent Application No. 61/255,590, entitled "Imprint Lithography", filed on Oct. 28, 2009. The content of that application is incorporated herein in its entirety by reference.

FIELD

The present invention relates to an imprint template and to a method of imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized feature or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable liquid medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

When forming, for example, an integrated circuit on a substrate using imprint lithography, it may be necessary to provide several patterned layers on the substrate. It is desirable to align a pattern which is being imprinted into imprintable medium on the substrate with a pattern that has previously been provided on the substrate. One way in which this may be achieved is by providing one or more alignment marks on the substrate and one or more alignment marks on the imprint template, and determining the relative position of the alignment marks using a beam of non-actinic radiation (often referred to as alignment radiation).

SUMMARY

A problem arising from the use of alignment marks on an imprint template is that the alignment marks may provide insufficiently strong reflection or diffraction of alignment radiation to allow alignment of the imprint template and substrate.

According to an aspect, there is provided an imprint lithography template provided with an alignment mark, wherein the alignment mark is formed from dielectric material having a refractive index which differs from the refractive index of the imprint lithography template, the dielectric material having a thickness which is such that it provides a phase difference between alignment radiation which has passed through the dielectric material and alignment radiation which has not passed through the dielectric material.

According to an aspect, there is provided a method of imprint lithography comprising directing alignment radiation towards an alignment mark formed from dielectric material having a thickness which is such that some degree of reflection of the alignment radiation occurs due to constructive interference at the surface of the dielectric material, detecting alignment radiation reflected from the imprint template alignment mark and from a substrate alignment mark, aligning the substrate and the imprint template, then directing actinic radiation through the imprint template and through the dielectric material towards the substrate.

According to an aspect, there is provided a method of imprint comprising: directing alignment radiation towards an alignment mark formed from dielectric material provided on an imprint template, the dielectric material having a different refractive index from the imprint template and having a thickness which is such that it provides a phase difference between alignment radiation which has passed through the dielectric material and alignment radiation which has not passed through the dielectric material; detecting alignment radiation reflected from the imprint template alignment mark and from a substrate alignment mark; aligning the substrate and the imprint template; and directing actinic radiation through the imprint template and through the dielectric material towards the substrate.

According to an aspect, there is provided a method of imprint comprising directing alignment radiation towards an imprint template alignment mark formed from a plurality of lines arranged to act as a wire grid polarizer, the alignment radiation being polarized substantially parallel to a direction in which the lines extend, detecting alignment radiation reflected from the imprint template alignment mark and from a substrate alignment mark, aligning the substrate and the imprint template, and directing actinic radiation through the imprint template and through the wire grid polarizer towards the substrate.

BRIEF DESCRIPTION OF THE DRAWINGS

Specific embodiments of the invention will be described with reference to the accompanying figures, in which.

DETAILED DESCRIPTION

Figure 1A:
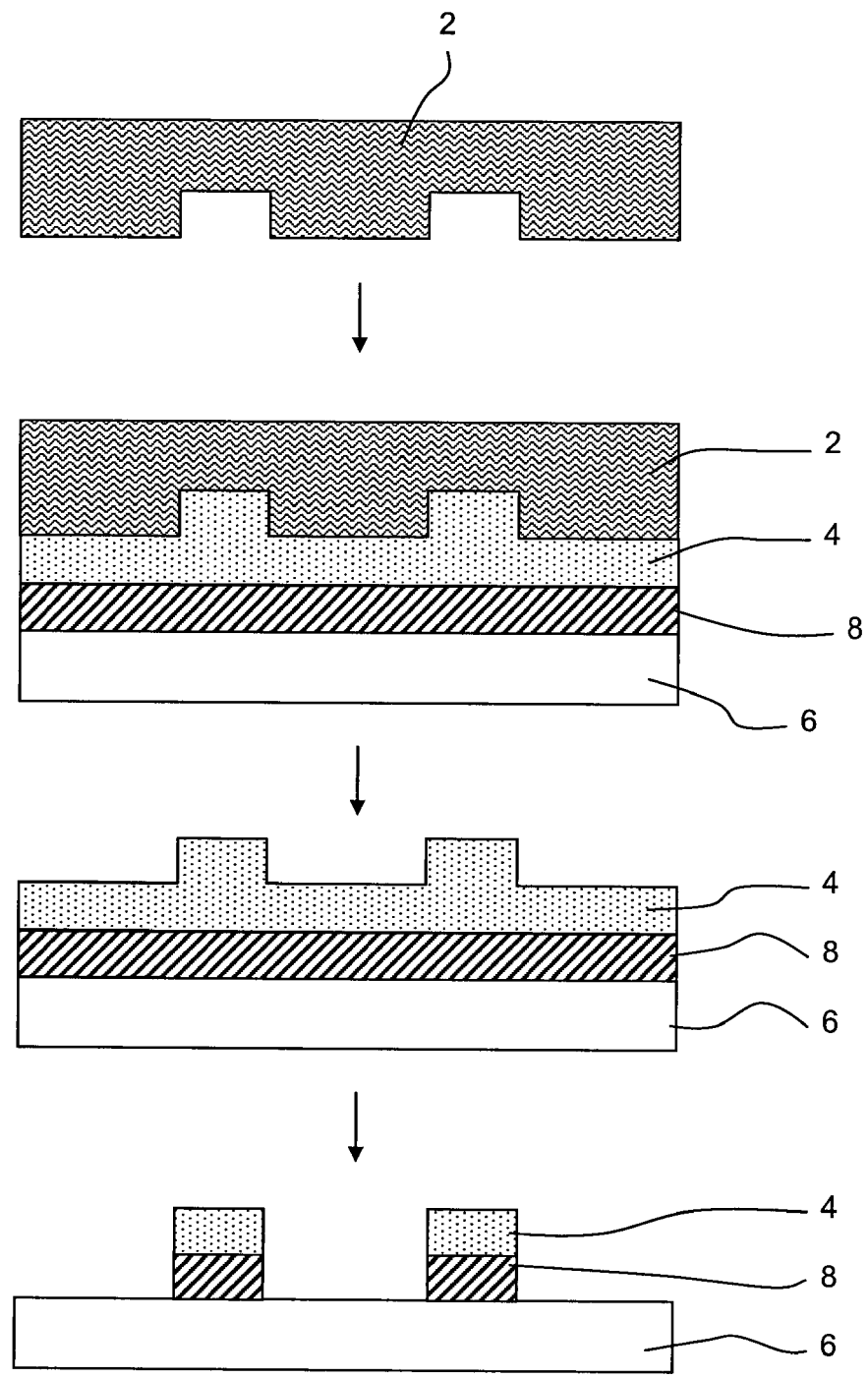
FIGS. 1a and 1b schematically depict examples of, respectively, hot imprint, and UV imprint lithography.
Figure 1B:
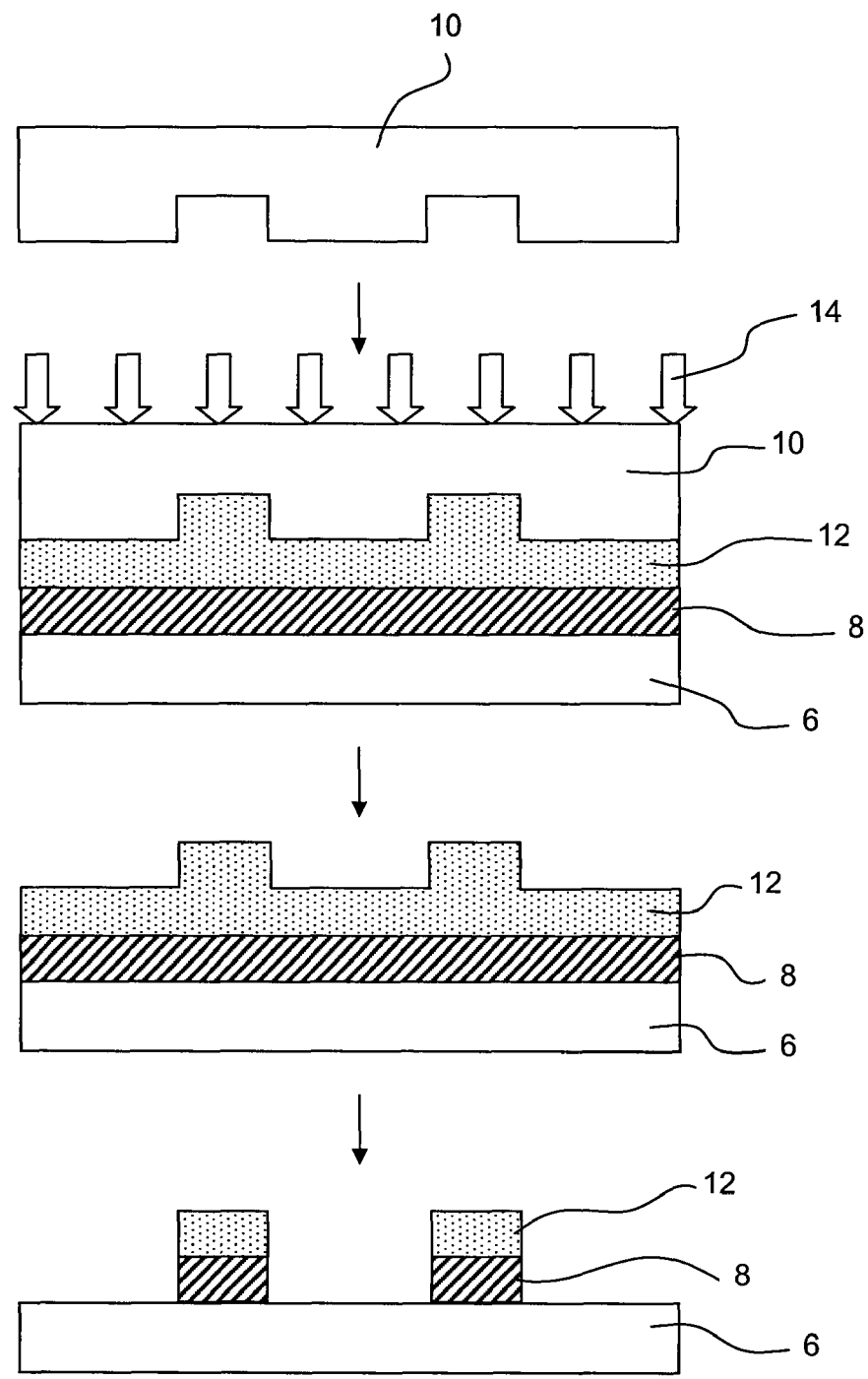

Examples of approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template comes into contact with the flowable resin and then the flowable resin is cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly(methyl methacrylate), polystyrene, poly(benzyl methacrylate) or poly(cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV, and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable imprintable medium 12, e.g., resin in a similar manner to the process of FIG. 1a. However, instead of using heat or temperature cycling as in hot imprint, the pattern is frozen by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography, which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

When forming, for example, an integrated circuit on a substrate using imprint lithography, it may be necessary to provide several patterned layers on the substrate. It is desirable to align a pattern which is being imprinted into imprintable medium on the substrate with a pattern that has previously been provided on the substrate. One way in which this may be achieved is by providing one or more alignment marks on the substrate and one or more alignment marks on the imprint template, and determining the relative position of the alignment marks using a beam of non-actinic radiation (often referred to as alignment radiation).

Figure 2:
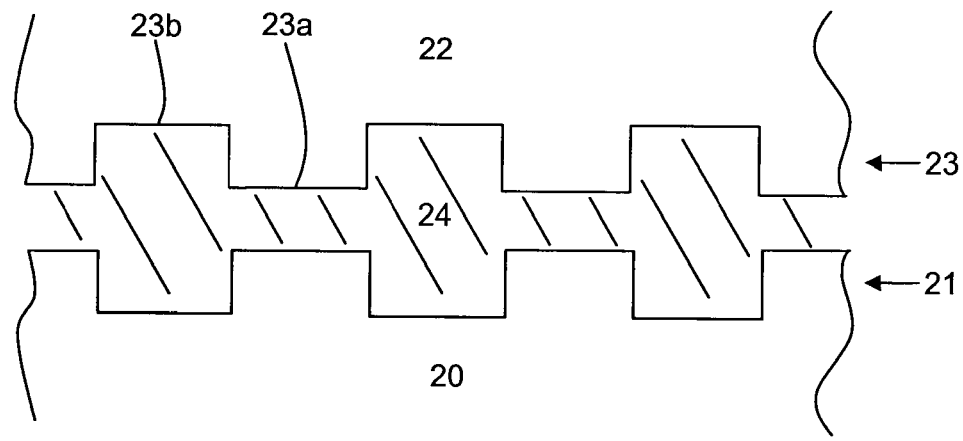
FIG. 2 schematically depicts an imprint template alignment mark arrangement which is known from the prior art.

FIG. 2 shows schematically in cross-section a prior art arrangement of a part of an imprint template 22. The imprint template 22 has an alignment mark comprising a diffraction grating (referred to hereafter as imprint template alignment grating 23). Also shown in FIG. 2 is part of a substrate 20 provided with an alignment mark which comprises a diffraction grating (referred to hereafter as substrate alignment grating 21). Imprintable medium 24 is located between the substrate 20 and the imprint template 22, and occupies recesses of the substrate alignment grating 21 and recesses of the imprint template alignment grating 23. For ease of illustration, only part of the imprint template alignment grating 23 and the substrate alignment grating 21 is shown in FIG. 2.

In use, a beam of non-actinic radiation (referred to hereafter as alignment radiation) is directed at the imprint template alignment grating 23. The radiation is diffracted by the imprint template alignment grating 23, and is also diffracted by the substrate alignment grating 21. A detector (not shown) which monitors radiation reflected from the alignment gratings 21, 23 provides a signal which is used to determine the relative location of the alignment gratings (thereby allowing the imprint template 22 and the substrate 20 to be aligned).

A problem associated with the alignment method described above is that the imprint template alignment grating 23 may provide poor diffraction of the alignment radiation. This is because the refractive index of the imprint template 22 and the refractive index of the imprintable medium 24 are similar. For example, the imprint template may be formed from quartz which has a refractive index of 1.5 and the imprintable medium 24 may comprise SFIL resist, SiMat resist or Monomat resist, which may have a refractive index between 1.4 and 1.5. Consequently, the optical path length experienced by radiation which passes through a non-recessed part 23a of the imprint template is similar to the optical path length experienced by radiation which passes through a recessed part 23b of the imprint template. Since the optical path lengths are similar, the strength of diffraction provided by the imprint template alignment grating is poor. Because the imprint template alignment grating 23 provides poor diffraction of the alignment radiation, an alignment signal detected by an alignment detector may have a low signal strength. This may lead to poor alignment between the imprint template 22 and the substrate 20.

Figure 3:
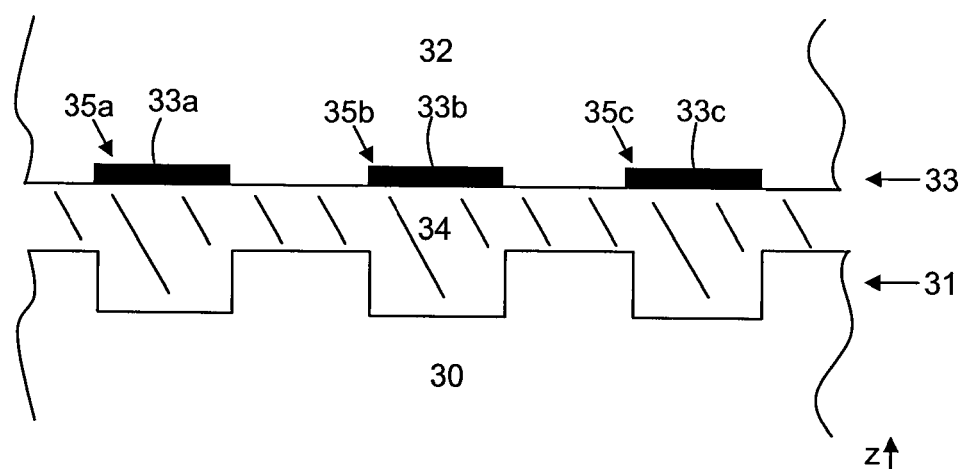
FIG. 3 schematically depicts an imprint template alignment mark according to an embodiment of the invention.

FIG. 3 shows schematically in cross-section part of an imprint template according to an embodiment of the invention. Referring to FIG. 3, an imprint template 32 is provided with an alignment mark which comprises a diffraction grating (referred to hereafter as the imprint template alignment grating 33). The imprint template alignment grating 33 comprises a plurality of strips of dielectric material 33a-c which are provided in recesses 35a-c in the imprint template 32. The dielectric material 33a-c has a refractive index which is different to the refractive index of the imprint template 32. Also shown in FIG. 3 is part of a substrate 30 and a substrate alignment grating 31. Imprintable medium 34 is provided between the imprint template 32 and the substrate 30.

In the following description, the term "dielectric material" is used to refer to a dielectric material having a refractive index which is different to the refractive index of the imprint template. The difference may be, e.g., more than 5%, more than 10%, more than 20%, more than 30%, or more than 40%.

The thickness of the strips of dielectric material 33a-c (z-direction dimension in FIG. 3), in combination with the refractive index of the strips of dielectric material, is selected such that the strips of dielectric material increase the strength of diffraction provided by the imprint template alignment grating 33. In one example, the thickness of the strips of dielectric material 33a-c is substantially equal to one quarter of the wavelength of the alignment radiation in the dielectric material. This substantially maximizes the phase contrast which is provided by the imprint template alignment grating 33.

In one example, the wavelength of the alignment radiation is 633 nm, and the thickness of the dielectric layer is 89 nm. If the dielectric material has a refractive index n=1.77, then the wavelength of the of the alignment radiation in the dielectric material is 633/1.77=358 nm. One quarter of this is 89 nm.

Since the thickness of the strips of dielectric material 33a-c is substantially equal to one quarter of the wavelength of the alignment radiation in the dielectric material, the resulting phase difference between alignment radiation which has passed through the dielectric material and radiation which has not gives rise to strong diffraction. The imprint template alignment grating 33 provides stronger diffraction of the alignment radiation than that the imprint template alignment grating 23 of FIG. 2. Since stronger diffraction of the alignment radiation is provided by the imprint template alignment grating 33 of FIG. 3, the alignment signal detected by an alignment detector (not shown) is stronger than that which would be provided by the arrangement of FIG. 2. This allows more accurate alignment of the imprint template 32 and substrate 30 to be achieved.

An alignment signal provided by the embodiment of the invention shown in FIG. 3 may be 10 or more times stronger than the alignment signal which would be seen using the arrangement shown in FIG. 2. The strength of the alignment signal may depend upon other factors, such as the separation between the imprint template and the substrate.

Although in the above described example the strips of dielectric material 33a-c have a thickness which is one quarter of the wavelength of the alignment radiation, other thicknesses may be used. The thickness may, for example, be equal to the wavelength of the alignment radiation plus one quarter of that wavelength, two times the wavelength of the alignment radiation plus one quarter of that wavelength, etc (where the wavelength is adjusted to take into account the refractive index of the dielectric material). Similarly, the thickness may alternatively be equal to the wavelength of the alignment radiation plus three quarters of that wavelength, two times the wavelength of the alignment radiation plus three quarters of that wavelength, etc (where the wavelength is adjusted to take into account the refractive index of the dielectric material). This may be expressed as:

$$t = \frac{\lambda}{n}\left(\frac{N}{2} + \frac{1}{4}\right) \quad \text{(Equation 1)}$$

where t is the thickness of the strips of dielectric material, λ is the wavelength of the alignment radiation in vacuum, n is the refractive index of the dielectric material, and N is an integer.

The thickness of the strips of dielectric material may be substantially equal to a thickness defined by Equation 1. In this context, the term "substantially equal" is intended to mean that the thickness is sufficiently close to a thickness defined by Equation 1 that it provides diffraction which is stronger than the diffraction provided by the imprint template alignment grating of FIG. 2. For example, the dielectric material may be a few nanometers thicker or thinner than a thickness defined by Equation 1. This may lead to a reduction of the strength of diffraction provided by the imprint template alignment grating 33, but may nevertheless provide diffraction which is stronger than the diffraction provided by the imprint template alignment grating of FIG. 2.

The dielectric material may be, for example, silicium nitride. The dielectric material may have, for example, a refractive index greater than 1.6, or a refractive index greater than 1.7.

The substrate alignment grating 31 corresponds to that used in the prior art. The substrate alignment grating provides strong diffraction because there is a substantial difference between the refractive index of the imprintable medium 34 and the refractive index of the substrate 30. In an embodiment the substrate may be opaque, such that the substrate alignment grating provides strong diffraction. The substrate grating may alternatively be formed in the same manner as the imprint template alignment grating 33 of FIG. 3 (or any other embodiment of the invention) if so desired.

Once alignment of the imprint template 32 and substrate 30 has been achieved, actinic radiation may be directed through the imprint template 32 and onto the imprintable medium 34, in order to cure and thus solidify the imprintable medium. The strips of dielectric material 33a-c may transmit a substantial portion of the actinic radiation. This is because the thickness of the strips of dielectric material 33a-c is not one quarter of the wavelength of the actinic radiation (or some other thickness which would give rise to an unwanted phase difference). In one example, 70% of the actinic radiation incident upon dielectric strip 33a-c passes through those strips of dielectric material into the imprintable medium 34. It is not necessary that 100% of the actinic radiation passes through the strips of dielectric material 33a-c into the imprintable medium 34. It is desirable that sufficient actinic radiation passes through the strips of dielectric material 33a-c to cure imprintable medium 34 which is directly beneath the strips of dielectric material. For example, more than 50% of the actinic radiation incident upon a dielectric strip may pass through that dielectric strip, more than 60%, more than 70%, more than 80%, or more than 90%.

An advantage associated with the imprint template alignment grating 33 of FIG. 3 is that it provides the imprint template 32 with a flat lowermost surface in the vicinity of the alignment grating (rather than a surface with a series of highs and lows as seen in the prior art arrangement of FIG. 2). The flat lowermost surface in the vicinity of the alignment grating avoids air-inclusions being generated (air inclusions are sometimes seen where recesses are present in an imprintable template).

The imprint template alignment grating may be provided in a recess (the recess being larger than the imprint template alignment grating in order to accommodate the imprint template alignment grating).

It is not necessary that the depth of the recesses 35a-c corresponds exactly with the thickness of the strips of dielectric material 33a-c. It may be the case, for example, that the strips of dielectric material 33a-c only partially fill the recesses 35a-c.

In some instances the strips of dielectric material 33a-c may protrude from the recesses 35a-c. However, they should not protrude so far that they prevent imprinting of a pattern onto the substrate from taking place.

The imprint template alignment grating 33 may be provided in the imprint template 32 using known fabrication methods. For example, a pattern which corresponds to the recesses 35a-c may be formed in a layer of resist (e.g. using optical lithography or imprint lithography). The pattern may then be used to etch the recesses 35a-c into the imprint template 32 using a conventional etching technique, such that the recesses have a depth which, for example, corresponds to one quarter of the wavelength of the alignment radiation. The recesses 35a-c may then be filled with dielectric material using a conventional method.

The strips of dielectric material 33a-c may comprise multiple layers of material. The layers may, for example, alternate between layers of material having a first refractive index and layers of material having a second different refractive index. This provides multiple interfaces rather than a single interface. The thickness of the layers of material, and their refractive indices, may be selected to provide reflection of the alignment radiation. At least some of the layers may, for example, have a thickness which is equal to the wavelength of the alignment radiation (taking into account the materials' refractive indices). In an embodiment, layers of silicium nitride may be alternated with layers of silicon dioxide.

Figure 4:
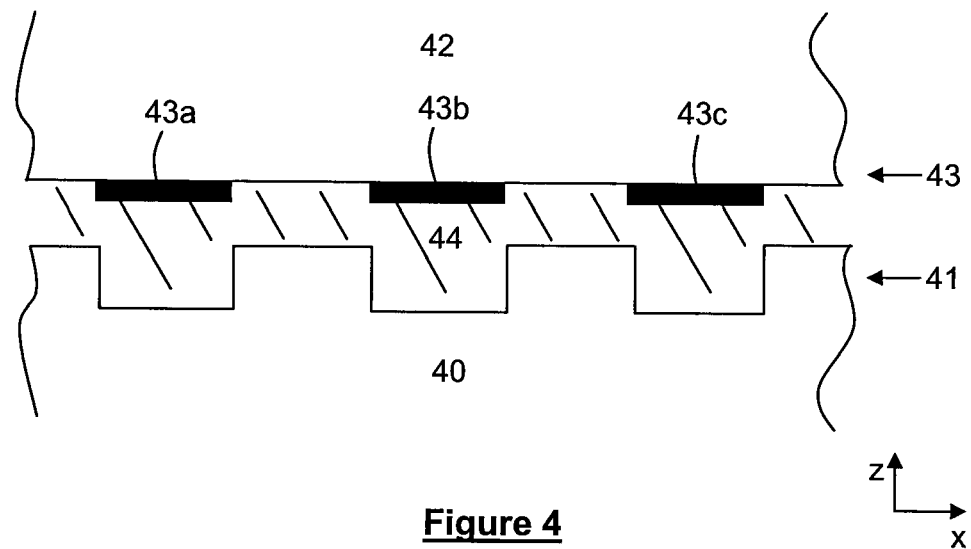
FIG. 4 schematically depicts an imprint template alignment mark according to an embodiment of the invention.

FIG. 4 shows in cross-section part of an imprint template 42 according to an embodiment of the invention. The imprint template 42 is provided with an imprint template alignment grating 43 which comprises a series of strips of dielectric material 43a-c which act as a diffraction grating. A lowermost surface of the imprint template 42 is substantially flat, and the strips of dielectric material 43a-c protrude from this surface. The thickness of the strips of dielectric material 43a-c is selected (as described above in relation to the FIG. 3) in order to obtain stronger diffraction from the imprint template alignment grating 43.

The strips of dielectric material 43a-c may be sufficiently thin that they do not prevent imprinting of a pattern onto the substrate from taking place. Alternatively, the strips of dielectric material 43a-c may be provided in a recess, thereby allowing thicker strips of dielectric material to be provided, without the dielectric material preventing imprinting of a pattern onto the substrate from taking place.

Also shown in FIG. 4 is part of a substrate 40 and a substrate alignment grating 41. Imprintable medium 44 is provided between the imprint template 42 and the substrate 40. The imprint template alignment grating 43 is used to provide alignment between the imprint template 42 and the substrate 40 in a manner which corresponds to that described above in relation to FIG. 3.

The strips of dielectric material 43a-c may be formed, for example, using imprint lithography or optical lithography.

Figure 5:
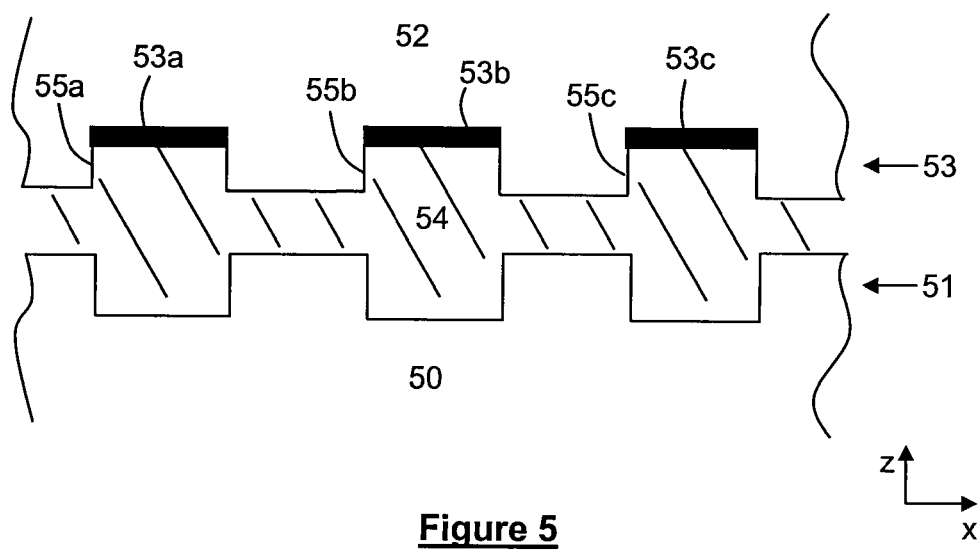
FIG. 5 schematically depicts an imprint template alignment mark according to an embodiment of the invention.

FIG. 5 shows schematically in cross-section part of an imprint template 52 according to an embodiment of the invention. The imprint template 52 is provided with an imprint template alignment grating 53 which corresponds substantially with the imprint template alignment grating 23 shown in FIG. 2. However, a layer of dielectric material 53a-c has been provided in each recess 55a-c of the imprint template alignment grating 53. The thickness of the dielectric material is selected in the manner described above in relation to FIG. 3, in order to obtain stronger diffraction from the imprint template alignment grating 53. In an alternative embodiment (not illustrated), dielectric material is provided on non-recessed portions of the imprint template alignment grating. Also shown in FIG. 5 is part of a substrate 50 and a substrate alignment grating 51. Imprintable medium 54 is provided between the imprint template 52 and the substrate 50. The imprint template alignment grating 53 is used to provide alignment between the imprint template 52 and the substrate 50 in a manner which corresponds to that described above in relation to FIG. 3.

Figure 6A:
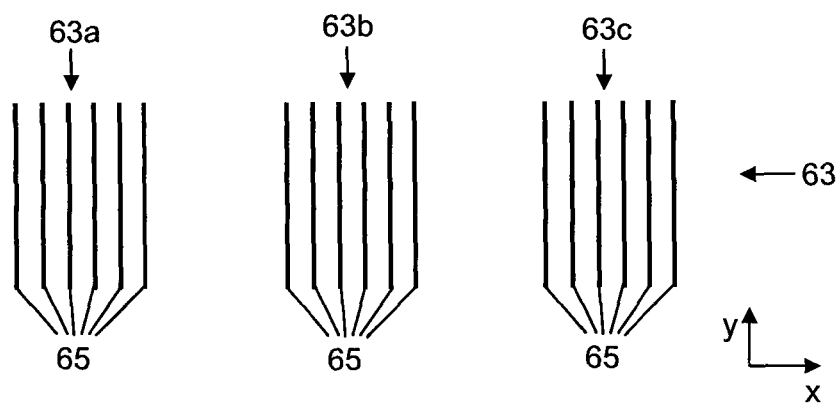
FIG. 6 schematically depicts an imprint template alignment mark according to an embodiment of the invention.

The strips of dielectric material 33a-c, 43a-c, and 53a-c may, in an embodiment, be replaced with groups of lines which act as polarizers. FIG. 6a shows schematically, viewed from above, part of an imprint template alignment grating 63 which comprises three sets of lines 65. The thickness of the lines 65, and the spacing between the lines, is such that the groups of lines act as wire-grid polarizers. The wire-grid polarizers are transmissive to alignment radiation which is polarized transverse to the direction in which the lines 65 extend, and is reflective to alignment radiation which is polarized, parallel to the direction in which the lines extend. In the context of the Cartesian coordinates shown in FIG. 6a, alignment radiation which is polarized in the x-direction will be transmitted by the lines 65, whereas alignment radiation which is polarized in the y-direction will be reflected by the lines 65.

Figure 6B:
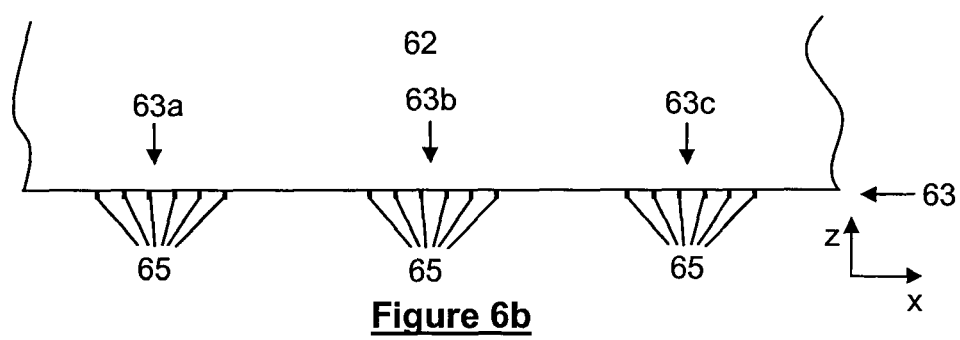

FIG. 6b shows schematically, viewed from one side, part of the imprint template alignment grating 63, together with part of an imprint template 62 upon which the imprint template alignment grating is provided. It can be seen from FIG. 6b that the lines 65 are provided on a substantially flat lowermost surface of the imprint template, the lines protruding from that surface. In an alternative arrangement (not illustrated), the lines 65 may be provided in recesses in the imprint template such that they do not protrude from the surface of the imprint template. For example, each group of lines may be provided in a separate recess, or a plurality of groups of lines may be provided in the same recess.

In use, alignment radiation which is polarized substantially parallel to the direction in which the lines 65 extend is directed at the imprint template alignment grating 63. The groups of lines 63a-c thus act as reflectors, and the imprint template alignment grating 63 thus causes diffraction of the alignment radiation.

Groups of lines which act as wire-grid polarizers for alignment radiation may be used instead of the dielectric layers in the embodiments illustrated in FIGS. 3 to 5.

In use, once the imprint template and the substrate have been aligned, actinic radiation is directed onto the imprintable medium in order to cure the imprintable medium. The groups of lines 65 may act to some degree as a wire-grid polarizer for the actinic radiation. However, a significant proportion of the actinic radiation will be transmitted by the groups of lines 65, and will thus be incident upon imprintable medium located beneath the groups of lines. For example, if the actinic radiation is not polarized, then around 50% of the actinic radiation may be transmitted by the groups of lines 65. The actinic radiation may be polarized transverse to the direction in which the lines 65 extend (for example the x-direction in FIG. 6). Where this is done, more than 50% of the actinic radiation may be transmitted by the groups of lines 65. For example, substantially all of the polarized actinic radiation may be transmitted by the groups of lines 65. If substantially all of the polarized actinic radiation is transmitted by the groups of lines 65, the amount of actinic radiation delivered to the substrate in the vicinity of the groups of lines 65 will be substantially equal to amount of actinic radiation delivered to other locations on the substrate. This will provide curing of the imprintable medium in the vicinity of the groups of lines 65 which is substantially equal to curing at other locations on the substrate.

It is not essential that the amount of actinic radiation which passes through the groups of lines 63*a-c* and into the imprintable medium is the same as the amount of actinic radiation which passes into other areas of the imprintable medium. However, it is desirable that the amount of actinic radiation which passes through the groups of lines 63*a-c* is sufficient to cure the imprintable medium. Where this is done, defectivity problems which might arise if the imprintable medium were not cured are avoided.

The distance between neighboring lines 65 should be less than the wavelength of the alignment radiation (for example, 633 nm). The thickness of the lines 65 may, for example, be less than half of the distance between lines. The thickness of the lines 65 may be less than this.

The lines 65 may, for example, be formed using lithographic techniques. Alternatively, the lines 65 may be formed using electron-beam writing. The lines 65 may, for example, be formed using electron-beam writing at the same time that a pattern is being formed on the imprint template. The lines 65 are formed from a material which is electrically conducting (e.g. chrome or some other metal). The lines 65 may be formed, for example, by providing a layer of chrome on the imprint template, using lithography to form a pattern in resist provided on top of the layer of chrome, then etching through the pattern and the chrome in order to form lines in the chrome.

The lines 65 may be provided in a recess. The recess may be sufficiently deep that the lines 65 do not interfere with imprinting of a pattern onto a substrate.

U.S. Patent Application Publication No. US 2002/0098426 suggests the possibility of using a wire-grid polarizer to improve the amount of diffraction provided by an imprint template diffraction grating. However, US 2002/0098426 suggests using non-polarized alignment radiation. If this were to be done, then a substantial proportion of the alignment radiation would be transmitted by the wire-grid polarizers, to the detriment of the diffraction signal provided by the imprint template alignment grating. An embodiment of the invention may overcome this by using alignment radiation which is polarized such that it is not transmitted by the groups of lines 65, thereby providing a stronger diffraction signal than that which would be provided by the imprint template diffraction grating of US 2002/0098426.

Although above described embodiments of the invention have all referred to an imprint template alignment grating, an embodiment of the invention may be applied to imprint template alignment marks which are not gratings. For example, an embodiment of the invention may be applied to an imprint template alignment mark which comprises one or more box shapes, or any other suitable shape, which is monitored using an imaging detector in order to achieve alignment of the imprint template to a substrate. For example, a box shape may be formed from dielectric material having a thickness which satisfies Equation 1 above, thereby providing better phase contrast and allowing the box shape to be more clearly seen. Alternatively, the box shape may be formed from lines of material which act as a wire grid polarizer, etc.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarisation layers or anti-reflection coating layers.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, 4 or more) of substrate holders. In an embodiment, there is provided an apparatus that includes a plurality (e.g. 2, 3, 4 or more) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, 4 or more) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. A method of imprint comprising:
directing alignment radiation towards an alignment mark formed from dielectric material provided on an imprint template, the dielectric material having a different refractive index from the imprint template and having a thickness which is such that it provides a phase difference between alignment radiation which has passed through the dielectric material and alignment radiation which has not passed through the dielectric material;
detecting alignment radiation reflected from the imprint template alignment mark and from a substrate alignment mark;
aligning the substrate and the imprint template; and
directing actinic radiation through the imprint template and through the dielectric material towards the substrate.

2. The method of claim 1, wherein the dielectric material has a thickness t which is substantially equal to:

$$t = \frac{\lambda}{n}\left(\frac{N}{2} + \frac{1}{4}\right)$$

where $\lambda$ is the wavelength of the alignment radiation, n is the refractive index of the dielectric material, and N is an integer.

3. The method of claim 1, wherein the dielectric material is provided in recesses in the imprint template.

4. The method of claim 3, wherein the dielectric material does not protrude from the recesses in the imprint template.

5. The method of claim 1, wherein the dielectric material is provided on a substantially flat surface of the imprint template.

6. The method of claim 1, wherein the alignment mark is a diffraction grating which is formed from strips of the dielectric material.

7. The method of claim 1, wherein the alignment mark is a diffraction grating formed by recesses in the imprint template, the dielectric material being provided within the recesses or between the recesses.

8. The method of claim 1, wherein the dielectric material has a refractive index greater than or equal to 1.6.

9. The method of claim 1, wherein the dielectric material is a first dielectric material, and a second different dielectric material is also used to form the alignment mark, the second dielectric material having a different refractive index from the first dielectric material, and wherein the first and second dielectric materials are provided in alternating layers having thicknesses such that some degree of reflection of the alignment radiation occurs due to interference at interfaces between the first and second dielectric materials.

10. The method of claim 1, wherein the thickness of the dielectric material is such that more than 50% of actinic radiation which is incident upon the dielectric material passes through the dielectric material.

* * * * *